United States Patent
Park et al.

(10) Patent No.: US 6,506,676 B2
(45) Date of Patent: Jan. 14, 2003

(54) METHOD OF MANUFACTURING SEMICONDUCTOR DEVICES WITH TITANIUM ALUMINUM NITRIDE WORK FUNCTION

(75) Inventors: Dae Gyu Park, Kyungki-Do (KR); Tae Ho Cha, Kyungki-Do (KR); Se Aug Jang, Kyungki-Do (KR); Heung Jae Cho, Kyungki-Do (KR); Tae Kyun Kim, Kyungki-Do (KR); Kwan Yong Lim, Kyungki-Do (KR); In Seok Yeo, Seoul (KR); Jin Won Park, Chungcheongbuk-Do (KR)

(73) Assignee: Hynix Semiconductor Inc, Kyoungki-Do (KR)

( * ) Notice: Subject to any disclaimer, the term of this patent is extended or adjusted under 35 U.S.C. 154(b) by 0 days.

(21) Appl. No.: 10/033,509

(22) Filed: Dec. 27, 2001

(65) Prior Publication Data

US 2002/0086504 A1 Jul. 4, 2002

(30) Foreign Application Priority Data

Dec. 29, 2000 (KR) .................................. 2000-0085449

(51) Int. Cl.$^7$ .............................................. H01L 21/44
(52) U.S. Cl. ...................... 438/683; 438/685; 438/653; 438/656; 438/580
(58) Field of Search ................... 438/683, 685, 438/217, 224, 228–231, 289, 585, 653, 656, 202, 201; 257/407, 412, 385, 402

(56) References Cited

U.S. PATENT DOCUMENTS

| | | | | |
|---|---|---|---|---|
| 5,231,306 | A | * 7/1993 | Meikle et al. | 257/751 |
| 5,688,722 | A | * 11/1997 | Harrington, III | 438/217 |
| 6,238,739 | B1 | * 5/2001 | Madar et al. | 427/255 |
| 6,287,965 | B1 | * 9/2001 | Kang et al. | 438/648 |
| 6,373,111 | B1 | * 4/2002 | Zheng et al. | 257/407 |
| 2001/0043453 | A1 | * 11/2001 | Narwankar et al. | 361/306.3 |

OTHER PUBLICATIONS

Shew et al., "Effects of RF bias and nitrogen flow rates on the reactive sputtering of TiAlN films", Thin Solid Films 293, 1997, pp. 212–219.*

Kim et al., "Anti oxidation properties of TiAlN film prepared by plasma assisted CVD and roles of Al", Thin Solid Film 307, 1997, pp. 113–119.*

* cited by examiner

Primary Examiner—Olik Chaudhuri
Assistant Examiner—Yennhu B. Huynh
(74) Attorney, Agent, or Firm—Marshall, Gerstein & Borun

(57) ABSTRACT

A method of manufacturing semiconductor devices forms a surface channel CMOSFET in the process of manufacturing a metal gate. The method forms a $(Ti_xAl_y)_{1-z}N_z$ film (where z ranges from about 0.0 to about 0.2) having a work function value ranging from about 4.2 to about 4.3 eV on a gate insulating film in a nMOS region, a $(Ti_xAl_y)_{1-z}N_z$ film (where z ranges from about 0.3 to about 0.6) having a work function value ranging from about 4.8 to about 5.0 eV on the gate insulating film in a pMOS region, thus implementing a surface channel CMOS device both in the nMOS region and the pMOS region. Therefore, the threshold voltage is reduced.

21 Claims, 2 Drawing Sheets

METHOD OF MANUFACTURING SEMICONDUCTOR DEVICES WITH TITANIUM ALUMINUM NITRIDE WORK FUNCTION

TECHNICAL FIELD

A method of manufacturing semiconductor devices, and more particularly to, a method of semiconductor devices is disclosed wherein the devices are capable of reducing the threshold voltage ($V_{th}$), by which a metal gate electrode having a dual work-function having a low work-function in a nMOS region and a high work-function in a pMOS region is formed when a surface channel CMOSFET is formed during the process of manufacturing a metal gate, thus implementing a surface channel CMOS device both in the nMOS region and the pMOS region.

BACKGROUND

Generally, a silicon oxide film ($SiO_2$ film) is used as a gate dielectric film of a DRAM device and a logic device in mass-produced, semiconductor devices. As the design rule is scaled down, there is a trend that the thickness of the $SiO_2$ is reduced to below the range of 25~30 Å which limits tunneling. It is expected that the thickness of a DRAM gate dielectric film of a sub-0.10 μm technology is in the range of about 30~35 Å and the thickness of a logic device gate dielectric film is in the range of 13~15 Å. If a currently polysilicon gate electrode is continuously employed, however, the components in the thickness of the gate dielectric film, that is electrically increased by the gate poly depletion falls within the range of 3~8 Å, which thus significantly reducing the thickness of an effective gate oxide film ($T_{eff}$) to the approximate range of 15~30 Å.

Therefore, in order to overcome this problem, there has been recent efforts to adopt a high-k dielectric material as the gate dielectric film. Meanwhile, there has been efforts to minimize a poly gate depletion phenomenon by using a metal gate instead of a currently developed polysilicon gate. Also, in case of P$^+$ poly gate, a lot of research has recently been made since using the metal gate can prevent problems such as boron penetration. In case of the metal gate electrode, a lot of research has been conducted relating to the use of TiN or WN. The work function value is formed toward the valence band in a mid-gap work function since it has a work function in the range of 4.75~4.85 eV.

In case of the surface channel pMOSFET, it could be said that the work function is appropriate. However, in case of nMOSFET, it means that the threshold voltage ($V_{th}$) is almost in the range of 0.8~1.2 V when the channel doping is about 2~5×10$^{17}$/cm$^3$. In other words, in this case, a target threshold voltage of 0.3~0.6 V could not be achieved which is required in a high performance device having low-voltage or low-power characteristics. Therefore, in order to obtain a low threshold voltage of about 0.3~0.6 V both in nMOS and pMOS simultaneously, it is preferred that a dual metal electrode is used having the work function value of about 4.2 eV in case of nMOS and having the work function value of about 4.8 eV in case of pMOS.

SUMMARY OF THE DISCLOSURE

A method of manufacturing semiconductor devices which reduces the threshold voltage ($V_{th}$), in a way that a surface channel CMOS device is implemented both in nMOS and pMOS by forming a metal gate electrode having a dual work-function having a low work-function in a nMOS region and a high work-function in a pMOS region, when a surface channel CMOSFET is formed in a meta gate manufacture process.

The disclosed method of semiconductor devices comprises the steps of forming a P-well and a N-well in a semiconductor substrate to define an nMOS region and a pMOS, respectively; forming a first gate insulating film in the nMOS region and a second gate insulating film in, the pMOS region, respectively; forming a first $(Ti_xAl_y)_{1-z}N_z$ film on the first gate insulating film and a second $(Ti_xAl_y)_{1-z}N_z$ film on the second gate insulating film, respectively; forming a first metal gate electrodes on the first $(Ti_xAl_y)_{1-z}N_z$ film and a second metal gate electrodes on the second $(Ti_xAl_y)_{1-z}N_z$ film, respectively; and forming a N-type source/drain junction at the semiconductor substrate in the nMOS region and a P-type source/drain junction at the semiconductor substrate in the pMOS region, respectively.

In the above, the first $(Ti_xAl_y)_{1-z}N_z$ film has a work function value ranging from about 4.2 to about 4.3 eV, wherein z ranges from about 0.0 to about 0.2. The second $(Ti_xAl_y)_{1-z}N_z$ film has the work function value ranging from about 4.8 to about 5.0 eV, wherein z ranges from about 0.3 to about 0.6. Each of the first and second $(Ti_xAl_y)_{1-z}N_z$ films is formed with a thickness ranging from about 100 to about 500 Å.

BRIEF DESCRIPTION OF THE DRAWINGS

Various aspects and other features of the disclosed methods will be explained in the following description, taken in conjunction with the accompanying drawings, wherein.

DETAILED DESCRIPTION OF THE PRESENTLY PREFERRED EMBODIMENTS

The disclosed methods will be described in detail by way of a preferred embodiment with reference to accompanying drawings.

Figure 1:
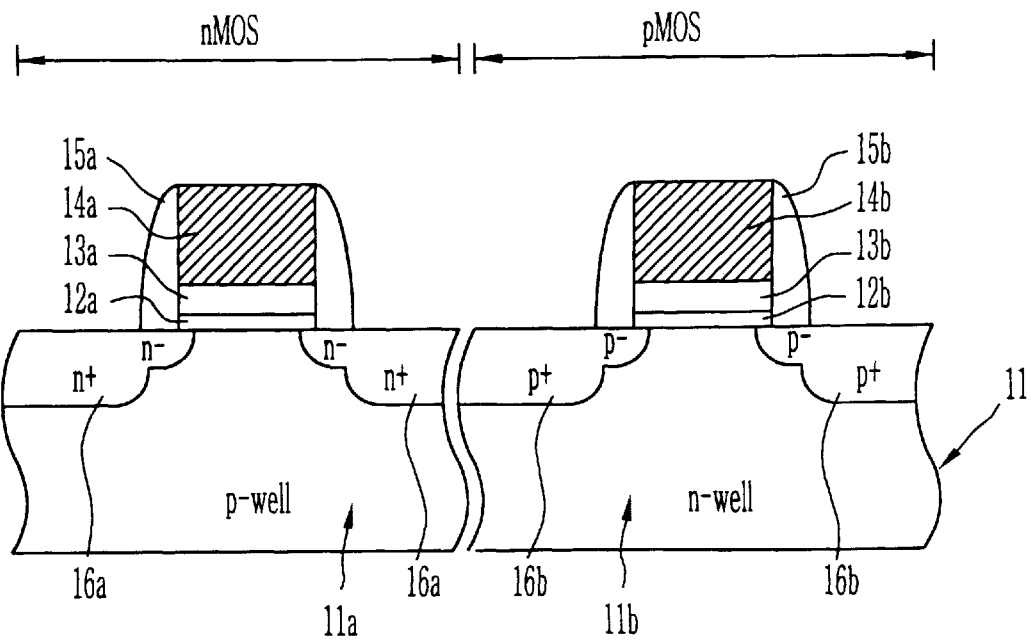
FIG. 1 is a cross-sectional view of a device for explaining a method of manufacturing semiconductor devices according to one embodiment of the disclosure.

Referring now to FIG. 1, there is shown a cross-sectional view of a device for explaining a method of manufacturing semiconductor devices according to one embodiment of the disclosure.

A device isolation film (not shown) is formed in a semiconductor substrate 11 to define an active region and a field region. A P-well 11a and a N-well 11b are respectively formed in selected portions of the semiconductor substrate 11 through a well formation process to define an nMOS region and a pMOS region. A first gate insulating film 12a is formed in the nMOS region and a second gate insulating film 12b is formed in the pMOS region. A first $(Ti_xAl_y)_{1-z}N_z$ film 13a is formed in the first gate insulating film 12a and a second $(Ti_xAl_y)_{1-z}N_z$ film 13b is formed in the second gate insulating film 12b. Also, a first metal gate electrodes 14a is formed in the first $(Ti_xAl_y)_{1-z}N_z$ film 13a and a second metal gate electrodes 14b is formed in the second $(Ti_xAl_y)_{1-z}N_z$ film 13b. A low-concentration impurity ion implantation process is formed with respect to the nMOS region and the pMOS region, respectively, to form first and second insulating film spacers 15a and 15b at the side walls of the first and second metal gate electrodes 14a and 14b. A high-concentration impurity ion implantation process is formed to form a N-type source/drain junction 16a of a LDD structure in the nMOS region and a P-type source/drain junction 16b of a LDD structure in the pMOS region, respectively.

In the above, the first $(Ti_xAl_y)_{1-z}N_z$ film 13a in the nMOS region has the work function value ranging from about 4.2 to about 4.3 eV, where z ranges from about 0.0 to about 0.2. The second $(Ti_xAl_y)_{1-z}N_z$ film 13b in the pMOS region has the work function value ranging from about 4.8 to about 5.0 eV, where z ranges from about 0.3 to about 0.6. Each of the first $(Ti_xAl_y)_{1-z}N_z$ film 13a and the second $(Ti_xAl_y)_{1-z}N_z$ film 13b is formed in thickness ranging from about 100 to about 500 Å, respectively. The first and second metal gate electrodes 14a and 14b are formed with tungsten (W).

Figure 2:
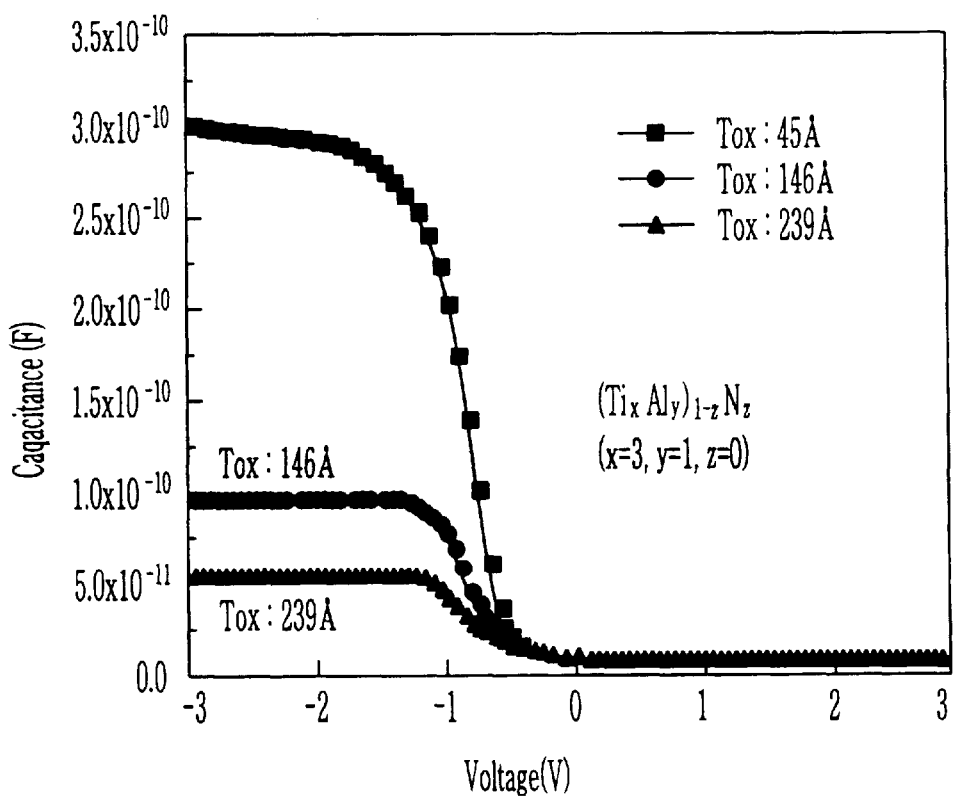
FIG. 2 illustrates, graphically, capacitance and voltage depending on the thickness of a gate oxide film in a $Ti_3Al$ film.

Generally, in order to find the work function value of the gate electrode, as shown in FIG. 2, a capacitance-voltage (C-V) curve for the thickness of several gate oxide film is obtained and a flat-band voltages ($V_{FB}$) is then obtained with respect to each of the thickness in the C-V curve.

Figure 3:
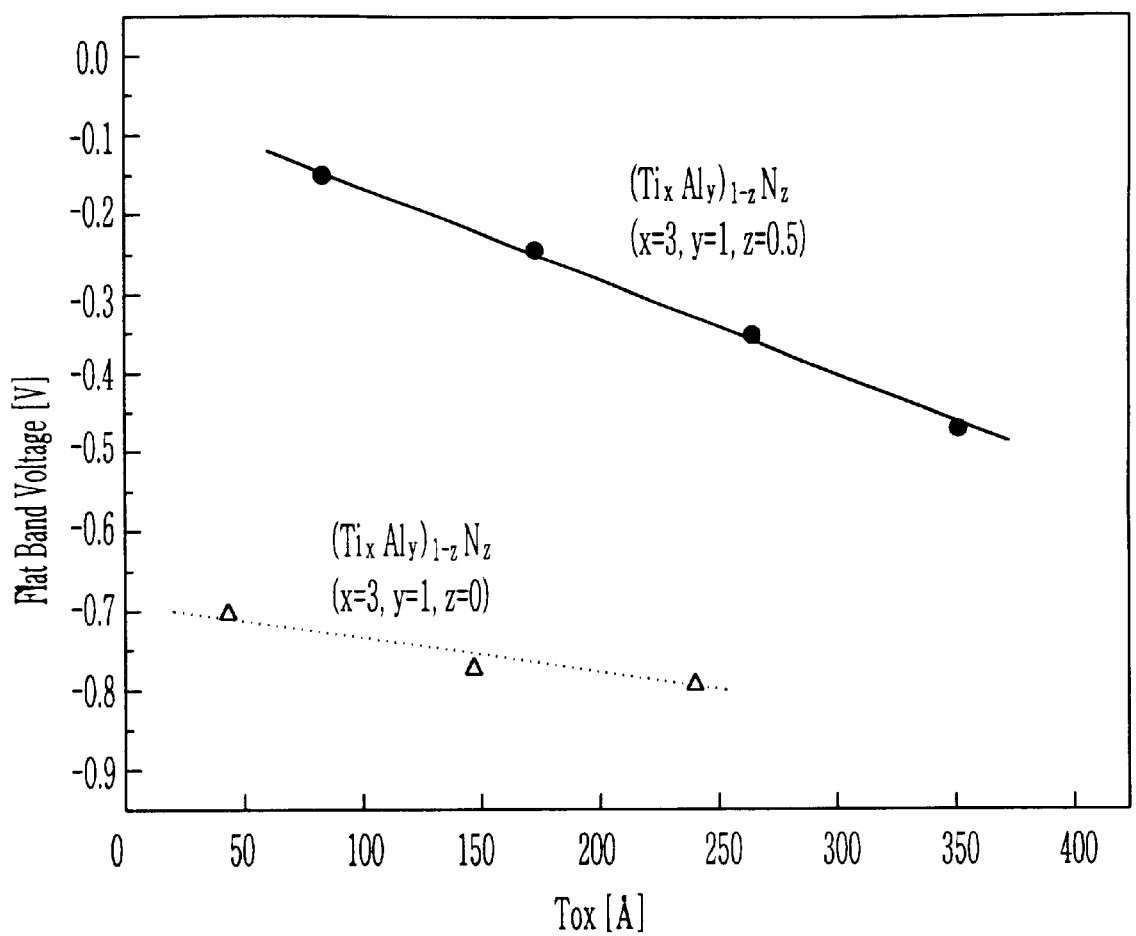
FIG. 3 illustrates, graphically, a flat band voltage depending on the thickness of the gate oxide film in a $Ti_3Al$ film and a $(Ti_3Al)_{0.5}N_{0.3}$ film.

Referring now to FIG. 2, there is shown a C-V curve of the $Ti_3Al$ film. It should be understood that $Ti_3Al$ film means the case of x=3, y=1 and z=0 in the $(Ti_xAl_y)_{1-z}N_z$ film. Thereafter, as shown in FIG. 3, the flat-band voltage curve depending on the effective gate oxide film thickness ($T_{eff}$) in the $(Ti_xAl_y)_{1-z}N_z$ film is linearly fitted to obtain a single straight line. An intercept value where the straight line and a Y-axis meet corresponds to ($\phi_{ms}$/q). At this time, $\phi_{ms}$ indicates the difference in the work function value ($\phi_m$) of metal and the work function value ($\phi_s$) of silicon semiconductors.

In case that the work function value $(Ti_xAl_y)_{1-z}N_z$ film depending on the composition of nitrogen (N) is obtained by the above method, if the composition z of nitrogen (N) in the $(Ti_3Al)_{1-z}N_z$ film ranges from about 0.0 to about 0.2, the work function value ($\phi_m$) ranges from about 4.2 to about 4.3 eV. Also, if the composition z of nitrogen (N) in the $(Ti_3Al)_{1-z}N_z$ film ranges from about 0.3 to about 0.6, the work function value ($\phi_m$) ranges from about 4.8 to about 5.0 eV. In other words, if the nitrogen (N) content is below 20%, the work function ranging from about 4.2 to about 4.3 eV could be obtained and if the composition of nitrogen (N) is more than 30%, the work function ranging from about 4.8 to about 5.0 eV could be obtained. This means that a CMOS metal gate electrode having a dual work function can be implemented by controlling the amount of nitrogen (N) in the $(Ti_xAl_y)_{1-z}N_z$ film. Therefore, in the present invention, the $(Ti_xAl_y)_{1-z}N_z$ film containing a small amount of nitrogen (N) below 20% is used in the nMOS and the $(Ti_xAl_y)_{1-z}N_z$ film containing a large amount of nitrogen (N) ranging from about 30 to about 60% is used in the pMOS, in using the $(Ti_xAl_y)_{1-z}N_z$ film as a gate.

More particularly, in order to form a $(Ti_xAl_y)_{1-z}N_z$ film having a low work function value (where, z ranges from about 0.0 to about 0.2) in the metal gate electrode of the nMOS, nitrogen reactive sputtering using a $Ti_xAl_y$ target is performed, where a ratio, x/y of the composition x of titanium (Ti) to the composition y of aluminum (Al) ranges from about 0.5 to about 20. At this time, the flow rate of nitrogen (N) ranges from about 0 to about 20 sccm, the flow rate of argon (Ar) ranges from about 5 to about 30 sccm and a RF power ranges from about 0.25 to about 15 kW. Also, in order to form the $(Ti_xAl_y)_{1-z}N_z$ film having a high work function (where, z ranges from about 0.3 to about 0.6) in the metal gate electrodes of the pMOS, nitrogen reactive sputtering using a $Ti_xAl_y$ target is performed, where a ratio, x/y of the composition x of titanium (Ti) to the composition y of aluminum (Al) ranges from about 0.5 to about 20. At this time, the flow rate of nitrogen (N) ranges from about 30 to about 100 sccm, the flow rate of argon (Ar) ranges from about 5 to about 30 sccm and a RF power ranges from about 0.25 to about 15 kW.

Meanwhile, the disclosed method may implement chemical vapor deposition (CVD) method or advanced CVD using as a precursor to change the composition of the $(Ti_xAl_y)_{1-z}N_z$ film so that the work function value can be adjusted. At this time, the precursor of titanium (Ti) may include one of $TiCl_4$, TDEAT(tetrakis diethylaminotitanium) and TDMAT (tetrakis dimethylaminotitanium), the precursor of aluminum (Al) may include one of $Cl_3$ and $TMA[Al(CH_3)_3]$, and a source of nitrogen (N) may use one of $NH_3$, $N_2$ and $ND_3$.

Further, the disclosed method may implement atomic layer deposition (ALD) to change the composition of the $(Ti_xAl_y)_{1-z}N_z$ film so that the work function value can be controlled. At this time, the precursor of titanium (Ti) may include one of $TiCl_4$, TDEAT (tetrakis diethylaminotitanium) and TDMAT(tetrakis dimethylaminotitanium), and the precursor of aluminum (Al) may include one of $AlCl_3$ and $TMA[Al(CH_3)_3]$. During the time between cycles when the $(Ti_xAl_y)_{1-z}N_z$ film is deposited using the precursor, one of $NH_3$, $N_2$ and $ND_3$ for purging materials may be used in order to adjust the nitrogen (N) content. The precursor can be deposited at the temperature ranging from about 50 to about 650° C. and at the pressure ranging from about 0.05 to about 3 Torr. At this time, the composition of nitrogen (N) is controlled by the number of each of the cycles.

As another method, remote plasma CVD (RPCVD) method may be employed. At this time, if ECR (electron cyclotron resonance) is used as a plasma source for remote plasma, the frequency ranges from about 2.0 to about 9 GHz may be used and one of helium(He), argon(Ar), krypton(Kr) and xenon (Xe) may be also used when a plasma is excited. Also, the flow rate of a used gas is controlled to control the relative amount of Ti/Al/N. At this time, when the precursor is deposited by means of remote plasma CVD method, a metal source such as titanium (Ti), aluminum (Al), and the like is injected into the chamber. However, the precursor is sprayed around the wafer and a nitrogen (N) source is introduced around the wafer by exciting the precursor around the plasma.

In addition to the above embodiments, the disclosed methods may employ a process of forming a $(Ti_xAl_y)_{1-z}N_z$ film having different compositions of nitrogen at the nMOS region and the pMOS transistor in a damascene gate, etc., to control the work function value.

As can be understood from the above description, the disclosed methods can implement a surface channel CMOS device both in a nMOS region and a pMOS region by controlling the nMOS region to have the work function value ranging from about 4.2 to about 4.3 eV and the pMOS region to have the work function value ranging from about 4.8 to about 5.0 eV, using a $(Ti_xAl_y)_{1-z}N_z$ film, when a gate of a semiconductor device is formed. Therefore, the disclosed methods can reduce the threshold voltage.

The disclosed methods have been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed:

1. A method of manufacturing semiconductor devices comprising:

forming a P-well and a N-well in a semiconductor substrate to define an nMOS region and a pMOS, respectively;

forming a first gate insulating film in said nMOS region and a second gate insulating film in said pMOS region, respectively;

forming a first $(Ti_xAl_y)_{1-z}N_z$ film on said first gate insulating film wherein "z" in said first $(Ti_xAl_y)_{1-z}N_z$ film ranges from about 0.0 to about 0.2 and a second $(Ti_xAl_y)_{1-z}N_z$ film on said second gate insulating film, respectively wherein "z" in said second $(Ti_xAl_y)_{1-z}N_z$ film ranges from about 0.3 to about 0.6;

forming a first metal gate electrodes on said first $(Ti_xAl_y)_{1-z}N_z$ film and a second metal gate electrodes on said second $(Ti_xAl_y)_{1-z}N_z$ film, respectively; and forming a N-type source/drain junction at said semiconductor substrate in said nMOS region and a P-type source/drain junction at said semiconductor substrate in said pMOS region, respectively.

2. The method of manufacturing semiconductor devices as claimed in claim 1, wherein said first $(Ti_xAl_y)_{1-z}N_z$ film has a work function value ranging from about 4.2 to about 4.3 eV.

3. The method of manufacturing semiconductor devices as claimed in claim 1, wherein a work function value of said second $(Ti_xAl_y)_{1-z}N_z$ film ranges from about 4.8 to about 5.0 eV.

4. The method of manufacturing semiconductor devices as claimed in claim 1, wherein said first and second $(Ti_xAl_y)_{1-z}N_z$ films are each formed with a thickness ranging from about 100 to about 500 Å.

5. The method of manufacturing semiconductor devices as claimed in claim 1, wherein each of said first and second $(Ti_xAl_y)_{1-z}N_z$ films are formed by nitrogen reactive sputtering.

6. The method of manufacturing semiconductor devices as claimed in claim 5, wherein each of said first and second $(Ti_xAl_y)_{1-z}N_z$ films is formed under conditions such that a flow rate of nitrogen (N) ranging from about 0 to about 20 sccm, the flow rate of argon (Ar) ranging from about 5 to about 30 sccm and the RF power ranging from about 0.25 to about 15 kW.

7. The method of manufacturing semiconductor devices as claimed in claim 5, wherein the forming of said first and second $(Ti_xAl_y)_{1-z}N_z$ films use a $Ti_xAl_y$ target.

8. The method of manufacturing semiconductor devices as claimed in claim 7, wherein in said $Ti_xAl_y$ target, a ratio of x:y ranges from about 0.5 to about 20.

9. The method of manufacturing semiconductor devices as claimed in claim 1, wherein each of said first and second $(Ti_xAl_y)_{1-z}N_z$ films is formed by means of a chemical vapor deposition (CVD) method or an advanced CVD method using a titanium (Ti) precursor, an aluminum (Al) precursor and a nitrogen (N) source.

10. The method of manufacturing semiconductor devices as claimed in claim 9, wherein said titanium (Ti) precursor comprises a material of $TiCl_4$, TDEAT and TDMAT.

11. The method of manufacturing semiconductor devices as claimed in claim 9, wherein said aluminum (Al) precursor comprises at least one of $AlCl_3$ and TMA.

12. The method of manufacturing semiconductor devices as claimed in claim 9, wherein said nitrogen (N) source comprises a material selected from the group consisting of $NH_3$, $N_2$ and $ND_3$.

13. The method of manufacturing semiconductor devices as claimed in claim 1, wherein the forming of each of said first and second $(Ti_xAl_y)_{1-z}N_z$ films uses a titanium (Ti) precursor and an aluminum (Al) precursor and each film is formed by an atomic layer deposition (ALD) method and a purging is carried out in order to control nitrogen (N) content between cycles when each of said first and second $(Ti_xAl_y)_{1-z}N_z$ films is deposited using the precursors.

14. The method of manufacturing semiconductor devices as claimed in claim 13, wherein said titanium (Ti) precursor comprises a material selected from the group consisting of $TiCl_4$, TDEAT and TDMAT.

15. The method of manufacturing semiconductor devices as claimed in claim 13, wherein said aluminum (Al) precursor comprises at least one of $AlCl_3$ and TMA.

16. The method of manufacturing semiconductor devices as claimed in claim 13, wherein a material for purging is utilized, said material for purging being selected from the group consisting of $NH_3$, $N_2$ and $ND_3$ and the nitrogen (N) content is controlled by repeating said purging cycle.

17. The method of manufacturing semiconductor devices as claimed in claim 13, wherein each of said first and second $(Ti_xAl_y)_{1-z}N_z$ films is formed at a temperature ranging from about 50 to about 650° C. under a pressure ranging from about 0.05 to about 3 Torr.

18. The method of manufacturing semiconductor devices as claimed in claim 1, wherein each of said first and second $(Ti_xAl_y)_{1-z}N_z$ films is formed using a remote plasma CVD method.

19. The method of manufacturing semiconductor devices as claimed in claim 18, wherein a plasma source for said remote plasma method uses an electron cyclotron resonance (ECR) source at a frequency ranging from about 2.0 to about 9 GHz and a gas selected from the group consisting of helium (He), argon (Ar), krypton (Kr) and xenon (Xe) when the plasma is removed.

20. The method of manufacturing semiconductor devices as claimed in claim 18, wherein each of said first and second $(Ti_xAl_y)_{1-z}N_z$ films is formed by introducing a titanium (Ti) metal source and an aluminum (Al) source into a chamber, wherein said titanium (Ti) metal source and said aluminum (Al) source are sprayed around a wafer and are then introduced around the wafer by exciting a nitrogen (N) source around the plasma.

21. A method of manufacturing semiconductor devices comprising:

forming a P-well and a N-well in a semiconductor substrate to define an nMOS region and a pMOS, respectively;

forming a first gate insulating film in said nMOS region and a second gate insulating film in said pMOS region, respectively;

forming a first $(Ti_xAl_y)_{1-z}N_z$ film on said first gate insulating film and a second $(Ti_xAl_y)_{1-z}N_z$ film on said second gate insulating film, respectively;

forming a first metal gate electrodes on said first $(Ti_xAl_y)_{1-z}N_z$ film and a second metal gate electrodes on said second $(Ti_xAl_y)_{1-z}N_z$ film, respectively;

forming a N-type source/drain junction at said semiconductor substrate in said nMOS region and a P-type source/drain junction at said semiconductor substrate in said pMOS region, respectively and wherein said first and second metal gate electrodes are formed of tungsten (W).

* * * * *